United States Patent
Yokoyama et al.

(10) Patent No.: US 8,106,419 B2
(45) Date of Patent: Jan. 31, 2012

(54) GROUP-III NITRIDE COMPOUND SEMICONDUCTOR LIGHT-EMITTING DEVICE, METHOD OF MANUFACTURING GROUP-III NITRIDE COMPOUND SEMICONDUCTOR LIGHT-EMITTING DEVICE, AND LAMP

(75) Inventors: Yasunori Yokoyama, Ichihara (JP); Hisayuki Miki, Chiba (JP)

(73) Assignee: Showa Denko K.K., Tokyo (JP)

( * ) Notice: Subject to any disclaimer, the term of this patent is extended or adjusted under 35 U.S.C. 154(b) by 189 days.

(21) Appl. No.: 12/377,522

(22) PCT Filed: Nov. 5, 2007

(86) PCT No.: PCT/JP2007/071507
§ 371 (c)(1),
(2), (4) Date: Feb. 13, 2009

(87) PCT Pub. No.: WO2008/056637
PCT Pub. Date: May 15, 2008

(65) Prior Publication Data
US 2010/0244040 A1    Sep. 30, 2010

(30) Foreign Application Priority Data
Nov. 8, 2006  (JP) ................................. 2006-302814

(51) Int. Cl.
*H01L 33/32* (2010.01)
(52) U.S. Cl. ..... 257/103; 257/79; 257/94; 257/E33.025; 257/E33.014
(58) Field of Classification Search .................... 257/79, 257/94, 103, E33.068, E33.025, E33.014
See application file for complete search history.

(56) References Cited

U.S. PATENT DOCUMENTS

| 5,122,845 | A | 6/1992 | Manabe et al. |
| 5,290,393 | A | 3/1994 | Nakamura |
| 6,442,184 | B1 * | 8/2002 | Ota et al. ................... 372/43.01 |
| 6,713,789 | B1 | 3/2004 | Shibata et al. |

(Continued)

FOREIGN PATENT DOCUMENTS
EP    1 041 609 A1    10/2000
(Continued)

OTHER PUBLICATIONS

N. Kumar, et al. "Deposition of Aluminum Nitride Films Using RF Reactive Sputtering," Dept. of Electrical and Computer Engineering, Drexel University, Philadelphia PA 19104, vol. 68, 1986 Materials Research Society, pp. 357-363.

*Primary Examiner* — Cuong Q Nguyen
*Assistant Examiner* — Tran Tran
(74) *Attorney, Agent, or Firm* — Sughrue Mion, PLLC (57) ABSTRACT

A group-III nitride compound semiconductor light-emitting device, a method of manufacturing the group-III nitride compound semiconductor light-emitting device, and a lamp. The method includes the steps of: forming an intermediate layer (12) made of a group-III nitride compound on a substrate (11) by activating and reacting gas including a group-V element with a metal material in plasma; and sequentially forming an n-type semiconductor layer (14), a light-emitting layer (15), and a p-type semiconductor layer (16) each made of a group-III nitride compound semiconductor on the intermediate layer (12). Nitrogen is used as the group-V element, and the thickness of the intermediate layer (12) is in the range of 20 to 80 nm.

12 Claims, 5 Drawing Sheets

U.S. PATENT DOCUMENTS

| | | | |
|---|---|---|---|
| 2001/0009134 A1* | 7/2001 | Kim et al. | 117/8 |
| 2003/0109076 A1 | 6/2003 | Senda et al. | |
| 2004/0113163 A1* | 6/2004 | Steigerwald et al. | 257/88 |
| 2004/0115917 A1 | 6/2004 | Shibata et al. | |

FOREIGN PATENT DOCUMENTS

| | | |
|---|---|---|
| EP | 1 296 363 A1 | 3/2003 |
| EP | 1 479 795 A1 | 11/2004 |
| JP | 60-173829 A | 9/1985 |
| JP | 4297023 A | 10/1992 |
| JP | 5086646 B2 | 12/1993 |
| JP | 09-293897 A | 11/1997 |
| JP | 3026087 B2 | 1/2000 |
| JP | 2000-286202 A | 10/2000 |
| JP | 2001-308010 A | 11/2001 |
| JP | 2003-218396 A | 7/2002 |
| JP | 2003-096561 A | 4/2003 |
| JP | 3440873 B2 | 6/2003 |
| JP | 2003-252700 A | 9/2003 |
| JP | 2004-179457 A | 6/2004 |
| JP | 3700492 B2 | 7/2005 |
| JP | 2006-120841 A | 5/2006 |
| TW | 490866 B | 6/2002 |
| TW | 200300300 A | 5/2003 |
| WO | 03/043097 A1 | 5/2003 |

* cited by examiner

GROUP-III NITRIDE COMPOUND SEMICONDUCTOR LIGHT-EMITTING DEVICE, METHOD OF MANUFACTURING GROUP-III NITRIDE COMPOUND SEMICONDUCTOR LIGHT-EMITTING DEVICE, AND LAMP

TECHNICAL FIELD

The present invention relates to a group-III nitride compound semiconductor light-emitting device applicable to, for example, a light-emitting diode (LED), a laser diode (LD), or an electronic device, a method of manufacturing a group-III nitride compound semiconductor light-emitting device, and a lamp.

Priority is claimed on Japanese Patent Application No. 2006-302814, filed Nov. 8, 2006, the content of which is incorporated herein by reference.

BACKGROUND ART

A group-III nitride semiconductor light-emitting device has a direct-transition-type energy band gap corresponding to the range from visible light to ultraviolet light, and has high emission efficiency. Therefore, the group-III nitride semiconductor light-emitting device has been used as a light-emitting device, such as an LED or an LD.

When the group-III nitride semiconductor light-emitting device is used for an electronic device, it is possible to obtain an electronic device having better characteristics, as compared to when a group III-V compound semiconductor according to the related art is used.

In general, a single crystal wafer made of a group-III nitride semiconductor is obtained by growing a crystal on a single crystal substrate made of a different material. There is large lattice mismatch between the substrate and a group-III nitride semiconductor crystal epitaxially grown on the substrate. For example, when a gallium nitride (GaN) is grown on a sapphire ($Al_2O_3$) substrate, there is 16% lattice mismatch therebetween. When a gallium nitride is grown on a SiC substrate, there is 6% lattice mismatch therebetween.

In general, the large lattice mismatch makes it difficult to epitaxially grow a crystal on the substrate directly. Even though the crystal is grown on the substrate, it is difficult to obtain a crystal having high crystallinity.

Therefore, a method has been proposed in which, when a group-III nitride semiconductor crystal is epitaxially grown on a sapphire single crystal substrate or a SiC single crystal substrate by a metal organic chemical vapor deposition (MOCVD) method, a so-called low temperature buffer layer made of aluminum nitride (AlN) or aluminum gallium nitride (AlGaN) is formed on the substrate and a group-III nitride semiconductor crystal is epitaxially grown on the buffer layer at a high temperature (for example, see Patent Documents 1 and 2).

In addition, a technique has been proposed which forms a buffer layer using methods other than the MOCVD method. For example, the buffer layer is formed on a substrate by a sputtering method, and the substrate is formed of sapphire, silicon, silicon carbide, zinc oxide, gallium phosphide, gallium arsenide, magnesium oxide, manganese oxide, or a group-III nitride compound semiconductor single crystal. Among these materials, an a-plane sapphire substrate is preferable (for example, Patent Documents 3 and 4).

However, in the methods disclosed in Patent Documents 1 to 4, it is difficult to obtain a group-III nitride compound semiconductor having sufficiently high crystallinity.

Further, a method has been proposed which forms a buffer layer using a radio frequency sputtering method and grows a crystal having the same composition as the buffer layer using an MOCVD method (for example, Patent Document 5). However, in the method disclosed in Patent Document 5, it is difficult to form a stable and good crystal on a substrate.

Furthermore, a method has been proposed in which the initial voltage of a sputtering apparatus is lower than 110% of the sputtering voltage when a buffer layer is formed on a substrate by a sputtering method (for example, Patent Document 6). The methods disclosed in Patent Documents 3 to 6 form the buffer layer using a sputtering method without using an expensive material used in the MOCVD method.

[Patent Document 1] Japanese Patent No. 3026087
[Patent Document 2] JP-A-4-297023
[Patent Document 3] Japanese Patent No. 3440873
[Patent Document 4] Japanese Patent No. 3700492
[Patent Document 5] JP-B-5-86646
[Patent Document 6] JP-A-2001-308010

DISCLOSURE OF THE INVENTION

Problems to be Solved by the Invention

In the method disclosed in Patent Document 3, after a buffer layer is formed, annealing is performed on the buffer layer in a mixed gas atmosphere of ammonia and hydrogen. In the method disclosed in Patent Document 4, it is important that a buffer layer be formed at a temperature of more than 400° C. by DC sputtering. However, the inventors' experiments proved that it was difficult to obtain a group-III nitride compound semiconductor having high crystallinity under the conditions disclosed in Patent Documents 3 and 4.

The MOCVD method disclosed in Patent Documents 1 and 2 decomposes a raw material gas at a temperature that is higher than the decomposition temperature of the raw material gas and deposits the decomposed material on a substrate. The MOCVD method has a low deposition rate, but can form a film having high crystallinity.

Meanwhile, the sputtering method ejects atoms from a target and forcibly deposits the ejected atoms on a substrate. The sputtering method has a high deposition rate, but the film obtained by the sputtering method has a crystallinity that is lower than that obtained by the MOCVD method. For this reason, in the related art, the following method has generally been used: a method of forming a low-temperature buffer layer on a substrate using the MOCVD method and forming an undoped GaN layer with a thickness of several micrometers on the buffer layer, thereby improving the crystallinity of a light-emitting layer formed on the GaN layer.

However, in the method of forming a low-temperature buffer layer using the MOCVD method, it is difficult to obtain a film having sufficiently high crystallinity. Therefore, a method of forming a film having high crystallinity is needed.

The present invention has been made in order to solve the above-mentioned problems, and an object of the present invention is to provide a group-III nitride compound semiconductor light-emitting device that is capable of forming a uniform group-III nitride semiconductor on a substrate in a short time and has high productivity and good emission characteristics, a method of manufacturing a group-III nitride compound semiconductor light-emitting device, and a lamp.

Means for Solving the Problems

The inventors have conducted studies in order to solve the above problems and found a technique capable of forming an intermediate layer (buffer layer) using a method that activates a raw material in plasma, such as a sputtering method that has a deposition rate that is higher than that of an MOCVD method and forcibly deposits a film on a substrate, setting the thickness of the intermediate layer in an appropriate range to form the intermediate layer as an alignment film having specific anisotropy on the substrate, and increasing the deposition rate to prevent impurities adhered to the inside of a furnace from being mixed with a film, thereby achieving the present invention.

That is, the prevent invention is as follows.

According to a first aspect of the present invention, there is provided a method of manufacturing a group-III nitride compound semiconductor light-emitting device. The method includes the steps of: forming an intermediate layer made of a group-III nitride compound on a substrate by activating and reacting gas including a group-V element with a metal material in plasma; and sequentially forming an n-type semiconductor layer, a light-emitting layer, and a p-type semiconductor layer each made of a group-III nitride compound semiconductor on the intermediate layer. Nitrogen is used as the group-V element, and the thickness of the intermediate layer is in the range of 20 to 80 nm.

According to a second aspect of the present invention, in the method of manufacturing a group-III nitride compound semiconductor light-emitting device according to the first aspect, preferably, the intermediate layer is formed by a sputtering method.

According to a third aspect of the present invention, in the method of manufacturing a group-III nitride compound semiconductor light-emitting device according to the second aspect, preferably, the intermediate layer is formed by an RF sputtering method.

According to a fourth aspect of the present invention, in the method of manufacturing a group-III nitride compound semiconductor light-emitting device according to the third aspect, preferably, the intermediate layer is formed by the RF sputtering method while swing a magnet of a cathode.

According to a fifth aspect of the present invention, in the method of manufacturing a group-III nitride compound semiconductor light-emitting device according to any one of the second to fourth aspects, preferably, the intermediate layer is formed by a reactive sputtering method that introduces gas including nitrogen into a reactor.

According to a sixth aspect of the present invention, in the method of manufacturing a group-III nitride compound semiconductor light-emitting device according to any one of the first to fifth aspects, preferably, the metal material includes Al.

According to a seventh aspect of the present invention, in the method of manufacturing a group-III nitride compound semiconductor light-emitting device according to any one of the first to seventh aspects, preferably, the intermediate layer is formed of AlN.

According to an eighth aspect of the present invention, in the method of manufacturing a group-III nitride compound semiconductor light-emitting device according to any one of the first to seventh aspects, preferably, when the intermediate layer is formed, the temperature of the substrate is in the range of room temperature to 1000° C.

According to a ninth aspect of the present invention, in the method of manufacturing a group-III nitride compound semiconductor light-emitting device according to any one of the first to seventh aspects, preferably, when the intermediate layer is formed, the temperature of the substrate is in the range of 200° C. to 800° C.

According to a tenth aspect of the present invention, in the method of manufacturing a group-III nitride compound semiconductor light-emitting device according to any one of the first to ninth aspects, preferably, an underlying layer included in the n-type semiconductor layer is formed on the intermediate layer.

According to an eleventh aspect of the present invention, in the method of manufacturing a group-III nitride compound semiconductor light-emitting device according to the tenth aspect, preferably, the underlying layer is formed of a GaN-based compound semiconductor.

According to a twelfth aspect of the present invention, in the method of manufacturing a group-III nitride compound semiconductor light-emitting device according to the eleventh aspect, preferably, the underlying layer is formed of GaN.

According to a thirteenth aspect of the present invention, in the method of manufacturing a group-III nitride compound semiconductor light-emitting device according to the eleventh aspect, preferably, the underlying layer is formed of AlGaN.

According to a fourteenth aspect of the present invention, in the method of manufacturing a group-III nitride compound semiconductor light-emitting device according to any one of the tenth to thirteenth aspects, preferably, the intermediate layer and the underlying layer are formed of different group-III nitride compounds.

According to a fifteenth aspect of the present invention, in the method of manufacturing a group-III nitride compound semiconductor light-emitting device according to any one of the tenth to fourteenth aspects, preferably, the underlying layer is formed on the intermediate layer by an MOCVD method.

According to a sixteenth aspect of the present invention, in the method of manufacturing a group-III nitride compound semiconductor light-emitting device according to any one of the tenth to fifteenth aspects, preferably, when the underlying layer is formed, the temperature of the substrate is higher than 800° C.

According to a seventeenth aspect of the present invention, a group-III nitride compound semiconductor light-emitting device is manufactured by the manufacturing method according to any one of the first to sixteenth aspects.

According to an eighteenth aspect of the present invention, a group-III nitride compound semiconductor light-emitting device includes: a substrate; an intermediate layer that is made of a group-III nitride compound and is formed on the substrate by activating and reacting gas including a group-V element with a metal material in plasma; and an n-type semiconductor layer, a light-emitting layer, and a p-type semiconductor layer that are made of group-III nitride compound semiconductors and are sequentially formed on the intermediate layer. Nitrogen is used as the group-V element, and the thickness of the intermediate layer is in the range of 20 to 80 nm.

According to a nineteenth aspect of the present invention, in the group-III nitride compound semiconductor light-emitting device according to the eighteenth aspect, preferably, the intermediate layer has a composition including Al.

According to a twentieth aspect of the present invention, in the group-III nitride compound semiconductor light-emitting device according to the nineteenth aspect, preferably, the intermediate layer is formed of AlN.

According to a twenty-first aspect of the present invention, in the group-III nitride compound semiconductor light-emitting device according to any one of the eighteenth to twentieth aspects, preferably, the intermediate layer is formed so as to cover 90% or more of the front surface of the substrate.

According to a twenty-second aspect of the present invention, in the group-III nitride compound semiconductor light-emitting device according to any one of the eighteenth to twenty-first aspects, preferably, the intermediate layer is formed so as to cover at least the side surface of the substrate.

According to a twenty-third aspect of the present invention, in the group-III nitride compound semiconductor light-emitting device according to any one of the eighteenth to twenty-second aspects, preferably, the intermediate layer is formed so as to cover the side surface and the rear surface of the substrate.

According to a twenty-fourth aspect of the present invention, in the group-III nitride compound semiconductor light-emitting device according to any one of the eighteenth to twenty-third aspects, preferably, the intermediate layer is composed of an aggregate of columnar crystals.

According to a twenty-fifth aspect of the present invention, in the group-III nitride compound semiconductor light-emitting device according to the twenty-fourth aspect, preferably, in the intermediate layer, the average of the widths of grains of the columnar crystals is in the range of 1 to 100 nm.

According to a twenty-sixth aspect of the present invention, in the group-III nitride compound semiconductor light-emitting device according to the twenty-fourth aspect, preferably, in the intermediate layer, the average of the widths of grains of the columnar crystals is in the range of 2 to 70 nm.

According to a twenty-seventh aspect of the present invention, in the group-III nitride compound semiconductor light-emitting device according to any one of the eighteenth to twenty-sixth aspects, preferably, the intermediate layer has a hexagonal close-packed structure.

According to a twenty-eighth aspect of the present invention, in the group-III nitride compound semiconductor light-emitting device according to any one of the eighteenth to twenty-seventh aspects, preferably, an underlying layer included in the n-type semiconductor layer is formed on the intermediate layer.

According to a twenty-ninth aspect of the present invention, in the group-III nitride compound semiconductor light-emitting device according to the twenty-eighth aspect, preferably, the underlying layer is formed of a GaN-based compound semiconductor.

According to a thirtieth aspect of the present invention, in the group-III nitride compound semiconductor light-emitting device according to the twenty-ninth aspect, preferably, the underlying layer is formed of GaN.

According to a thirty-first aspect of the present invention, in the group-III nitride compound semiconductor light-emitting device according to the twenty-ninth aspect, preferably, the underlying layer is formed of AlGaN.

According to a thirty-second aspect of the present invention, a lamp includes the group-III nitride compound semiconductor light-emitting device according to any one of the seventeenth to thirty-first aspects.

ADVANTAGES OF THE INVENTION

According to a method of manufacturing a group-III nitride compound semiconductor light-emitting device of the prevent invention, an intermediate layer is formed on a substrate by a method that activates a raw material in plasma, such as a sputtering method, and the thickness of the intermediate layer is set in an appropriate range. In this way, it is possible to form a uniform group-III nitride compound semiconductor layer having high crystallinity on the intermediate layer by an MOCVD method.

Therefore, it is possible to effectively grow on a substrate an intermediate layer that is made of a group-III nitride compound and has high crystallinity and semiconductor layers that are made of group-III nitride semiconductors. As a result, it is possible to obtain a group-III nitride compound semiconductor light-emitting device that has high productivity and good emission characteristics and is inexpensive.

BEST MODE FOR CARRYING OUT THE INVENTION

Hereinafter, a group-III nitride compound semiconductor light-emitting device, a method of manufacturing a group-III nitride compound semiconductor light-emitting device, and a lamp according to an embodiment of the present invention will be described with reference to FIGS. 1 to 7.

In a method of manufacturing a group-III nitride compound semiconductor light-emitting device (hereinafter, simply referred to as a light-emitting device) according to this embodiment, gas including a group-V element and a metal material are activated and react with each other in plasma to form an intermediate layer 12 made of a group-III nitride compound on a substrate 11, and an n-type semiconductor layer 14, a light-emitting layer 15, and a p-type semiconductor layer 16 each made of a group-III nitride compound semiconductor are sequentially formed on the intermediate layer 12. In addition, nitrogen is used as the group-V element and the thickness of the intermediate layer 12 is in the range of 20 to 80 nm.

In the manufacturing method according to this embodiment, when a group-III nitride compound semiconductor crystal is epitaxially grown on the substrate 11, for example, a sputtering method is used to activate and react a raw material in plasma, thereby forming the intermediate layer 12 on the substrate 11. When the thickness of the intermediate layer is in the above-mentioned range, it is possible to form the intermediate layer 12 having high crystallinity as an alignment film having specific anisotropy on the substrate 11 in a short time. In this way, it is possible to effectively form a group-III nitride semiconductor having high crystallinity on the intermediate layer 12.

A laminated structure of a light-emitting device obtained by the manufacturing method according to this embodiment will be described using a laminated semiconductor 10 shown in FIG. 1. In the laminated semiconductor 10, the intermediate layer 12 made of a group-III nitride compound is formed on the substrate 11, and a semiconductor layer 20 is formed on the intermediate layer 12.

At least a metal raw material and gas including a group-V element are activated and react with each other in plasma to form the intermediate layer 12 on the substrate.

The semiconductor layer 20 includes an n-type semiconductor layer 14, a light-emitting layer 15, and a p-type semiconductor layer 16 formed in this order, and an underlying layer 14a included in the n-type semiconductor layer 14 is formed on the intermediate layer 12.

The intermediate layer 12 included in the laminated semiconductor 10 according to this embodiment has a thickness in the range of 20 to 80 nm.

Figure 1:
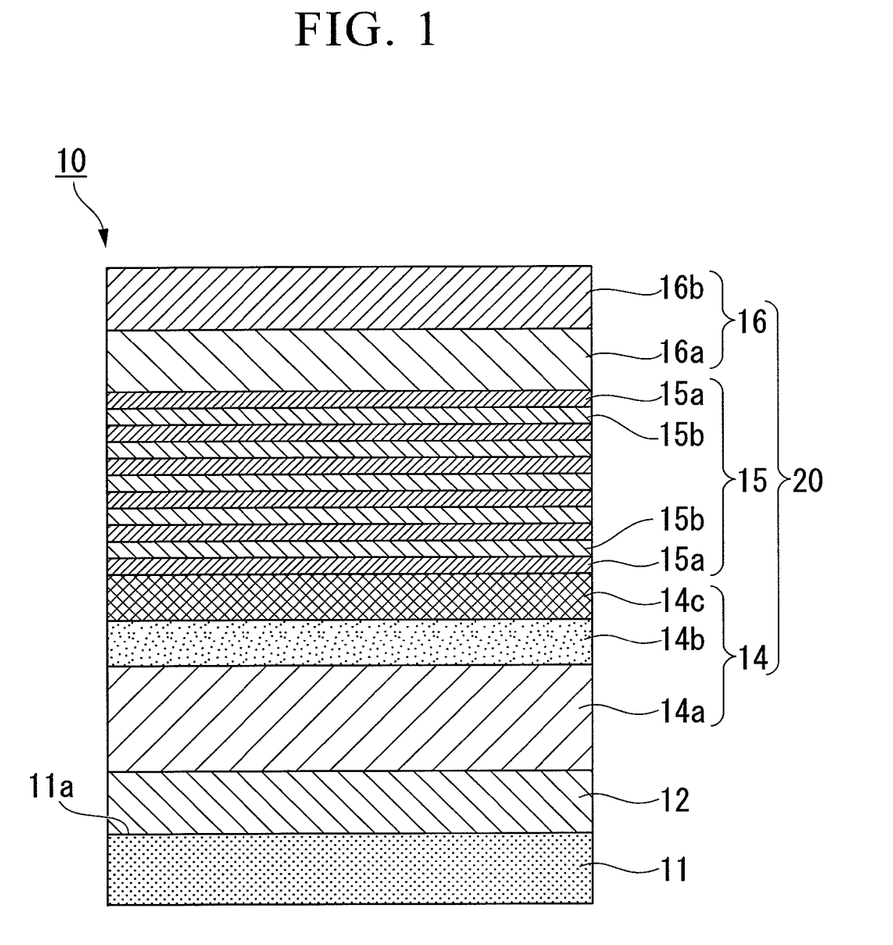
FIG. 1 is a cross-sectional view schematically illustrating an example of the structure of a laminated semiconductor of a group-III nitride compound semiconductor light-emitting device according to the present invention.

The laminated semiconductor 10 shown in FIG. 1 is formed by sequentially laminating on the substrate 11 the intermediate layer 12, the n-type semiconductor layer 14 including the underlying layer 14a, an n-type contact layer 14b, and an n-type clad layer 14c, a light-emitting layer 15 formed by alternately laminating barrier layers 15a and well layers 15b, and a p-type semiconductor layer 16 including a p-type clad layer 16a and a p-type contact layer 16b.

Figure 2:
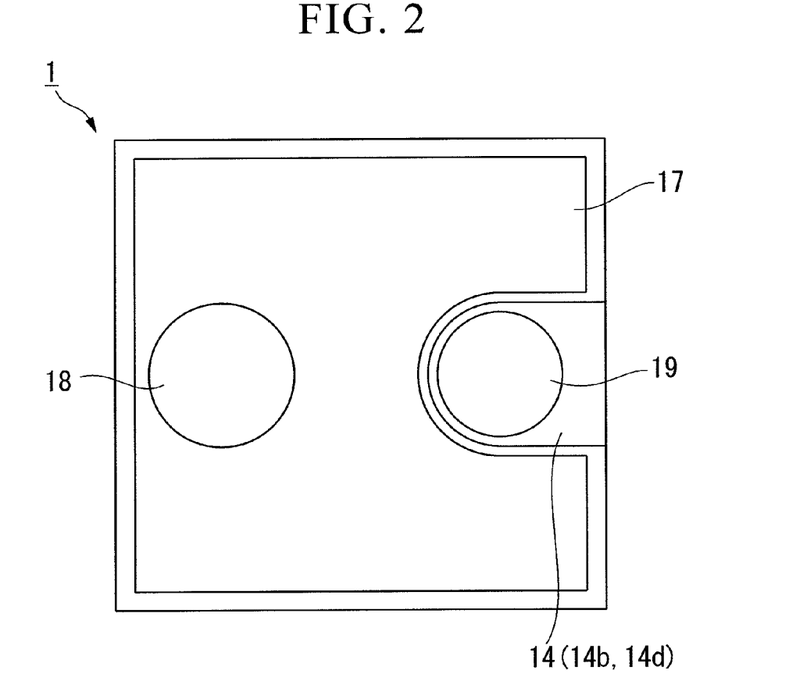
FIG. 2 is a plan view schematically illustrating an example of the structure of the group-III nitride compound semiconductor light-emitting device according to the present invention.
Figure 3:
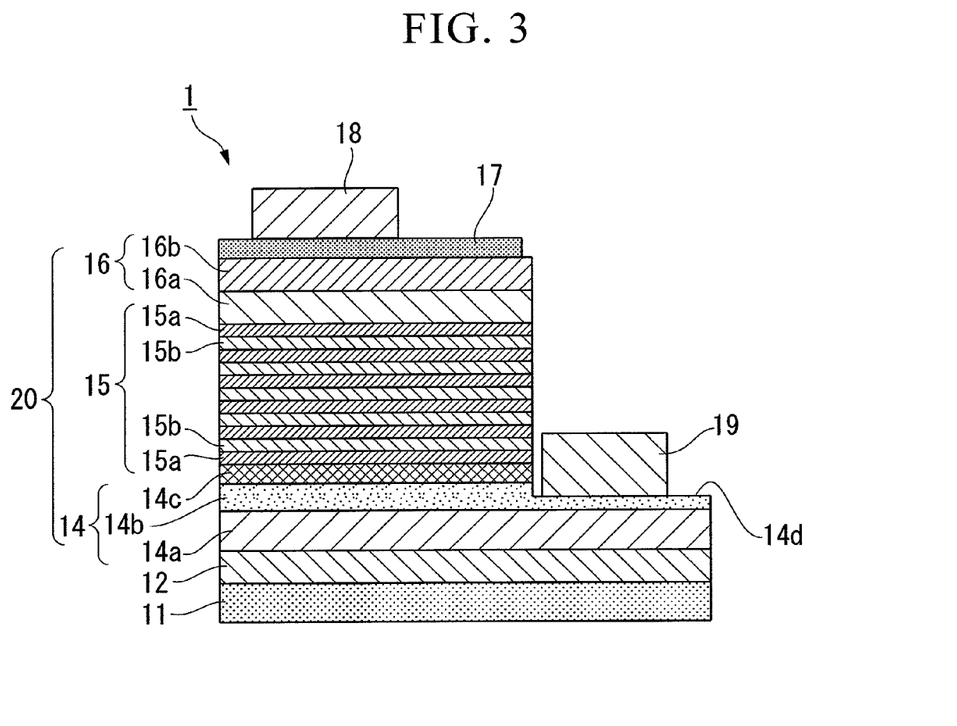
FIG. 3 is a cross-sectional view schematically illustrating an example of the laminated structure of the group-III nitride compound semiconductor light-emitting device according to the present invention.

As shown in FIGS. 2 and 3, in the laminated semiconductor 10 according to this embodiment, a transparent positive electrode 17 is formed on the p-type semiconductor layer 16, and a positive electrode bonding pad 18 is formed on the transparent positive electrode. In addition, an exposed region 14d is formed in the n-type contact layer 14b of the n-type semiconductor layer 14, and a negative electrode 19 is formed on the exposed region 14d. In this way, a light-emitting device 1 is formed.

Next, a light-emitting device and a method of manufacturing a light-emitting device according to this embodiment will be described in detail.

[Substrate]

In this embodiment, the substrate 11 may be formed of any material as long as a group-III nitride compound semiconductor crystal can be epitaxially grown on the surface of the substrate. For example, the substrate may be formed of any of the following materials: sapphire, SiC, silicon, zinc oxide, magnesium oxide, manganese oxide, zirconium oxide, manganese zinc iron oxide, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten, and molybdenum.

When the intermediate layer is formed without using ammonia, an underlying layer, which will be described below, is formed by a method of using ammonia, and an oxide substrate or a metal substrate made of a material that contacts ammonia at a high temperature to be chemically modified among the substrate materials is used, the intermediate layer according to this embodiment also serves as a coating layer. Therefore, this structure is effective in preventing the chemical modification of the substrate.

[Intermediate Layer]

In the laminated semiconductor 10 according to this embodiment, a metal raw material and gas including nitrogen are activated and react with each other in plasma to form the intermediate layer 12 that is made of a group-III nitride compound and has a hexagonal close-packed structure on the substrate 11. The film formed by a method using a metal raw material in plasma, such as this embodiment, is easy to align.

In a group-III nitride compound semiconductor device, such as an LED or an LD, a current needs to flow in a predetermined direction. Therefore, the group-III nitride compound semiconductor device needs to have high crystallinity and alignment. Since the group-III nitride compound semiconductor device is epitaxially grown on the intermediate layer 12, the intermediate layer 12 also needs to have high crystallinity and alignment.

An MOCVD method decomposes organic metal molecules to deposit metal elements. Therefore, in order to align the film, a base, such as a template, is needed. When the intermediate layer 12 is a low-temperature buffer layer that is grown on the substrate 11, a substrate serves as the base. The kind of available substrate is limited.

In the case of a reactive sputtering method, charged particles ejected into plasma do not necessarily exist as atoms, but exist as charged particles having dimer bonding. The charged particles serve as a raw material forming a film. Since the charged particles have moment, they are affected by an electric field caused by sputtering, and are deposited on the substrate 11 while having specific anisotropy. The anisotropy causes a film to have an alignment structure. Therefore, it is possible to form an alignment film on any kind of substrate using a sputtering method.

The intermediate layer 12 needs to cover 60% or more, and preferably, 80% or more of the front surface 11a of the substrate 11. It is preferable that the intermediate layer 12 be formed so as to cover 90% or more of the front surface 11a of the substrate 11, in terms of the function of a coating layer of the substrate 11. It is most preferable that the intermediate layer 12 be formed so as to cover 100% of the front surface 11a, that is, the entire front surface 11a of the substrate 11 without any gap.

When the area of the intermediate layer 12 covering the front surface 11a of the substrate 11 is reduced, a large area of the substrate 11 is exposed, and the intermediate layer 12 does not serve as a coating layer. As a result, a reaction occurs between the substrate and a semiconductor raw material growing a group-III nitride semiconductor crystal, and the flatness of an n-type semiconductor layer formed on the intermediate layer 12 is likely to be damaged.

The intermediate layer may be formed on the substrate 11 so as to cover only the front surface 11a of the substrate 11, or so as to cover the front surface 11a and the side surface of the substrate 11. It is most preferable that the intermediate layer be formed so as to cover the front surface 11a, the side surface, and the rear surface of the substrate 11 in terms of the function of a coating layer.

In the MOCVD method, in some cases, a raw material gas contacts the side surface or the rear surface of the substrate.

Therefore, in order to prevent the reaction between the raw material gas and the substrate, it is preferable to protect the side surface or the rear surface of the substrate 11.

In addition, in the intermediate layer 12, the average of the widths of grains of columnar crystals having a hexagonal close-packed structure is in the range of 1 to 100 nm. However, it is preferable that the average of the widths of grains be in the range 2 to 70 nm in terms of the function of a buffer layer.

In order to improve the crystallinity of a crystal layer made of a group-III nitride compound semiconductor, it is necessary to appropriately control the width of the grain of each columnar crystal. Specifically, it is preferable that the average of the widths of the crystal grains be within the above-mentioned range.

The width of the grain of each columnar crystal can be easily measured from a cross-section TEM photograph.

It is preferable that the grain of the crystal have a substantially columnar shape, as described above, and the intermediate layer 12 be composed of an aggregate of columnar grains.

The width of the grain is the distance between the interfaces of crystals when the intermediate layer 12 is an aggregate of columnar grains. When the grains are scattered, the width of the grain means the length of a diagonal line of the largest portion of the surface of the crystal grain coming into contact with the surface of the substrate.

As described above, it is preferable that the thickness of the intermediate layer 12 be in the range of 20 to 80 nm. When the thickness of the intermediate layer 12 is in the above-mentioned range, it is possible to form the intermediate layer 12 having high crystallinity as an alignment film having specific anisotropy on the substrate 11 in a short time. In addition, it is possible to form the semiconductor layer 20 having high crystallinity on the intermediate layer.

If the thickness of the intermediate layer is less than 20 nm, it is difficult to obtain a film having high crystallinity, and the performance of a coating layer is not sufficient. As a result, the crystallinity of a semiconductor layer formed on the intermediate layer is likely to be reduced.

If the thickness of the intermediate layer is more than 80 nm, it is difficult to obtain a film having high crystallinity, and the crystallinity of a semiconductor layer formed on the intermediate layer is likely to be reduced. In addition, the intermediate layer serves as a coating layer, but the deposition time is increased, which results in low productivity.

When the thickness of the intermediate layer 12 is in the above-mentioned range, it is possible to obtain a film having high crystallinity, and a mechanism for obtaining an alignment film having specific anisotropy is ambiguous. However, the inventors' studies proved that, when the intermediate layer was composed of an aggregate of columnar crystals having a hexagonal close-packed structure and the thickness of the intermediate layer was more than 80 nm, characteristics of each crystal become remarkable, and each crystal lost the function of a buffer layer; and when the thickness of the intermediate layer was less than 20 nm, the coverage of the substrate was reduced and a pit occurred in the intermediate layer, resulting in low crystallinity.

In addition, the inventors' studies proved that, when the thickness of the intermediate layer 12 was in the range of 20 to 80 nm, it was possible to obtain a sufficient coverage of the substrate 11 and form a film having high crystallinity as an alignment film having specific anisotropy on the substrate, and the semiconductor layer 20 formed on the intermediate layer 12 had high crystallinity (see Examples).

The intermediate layer 12 is preferably formed of a composition including Al, and more preferably, a composition including AlN.

The intermediate layer 12 may be formed of any kind of group-III nitride compound semiconductor represented by the general formula AlGaInN. In addition, the intermediate layer 12 may be formed of a material including a group-V element, such as As or P.

It is preferable that the intermediate layer 12 be formed of GaAlN as the composition including Al. In this case, it is preferable that the content of Al be 50% or more.

In addition, it is preferable that the intermediate layer 12 be formed of AlN. In this case, it is possible to effectively form an aggregate of columnar crystals.

The intermediate layer 12 may be formed of any material as long as it has the same crystal structure as a group-III nitride compound semiconductor. It is preferable that the intermediate layer be formed of a material having a lattice constant that is approximate to that of a group-III nitride compound semiconductor forming an underlying layer, which will be described below. In particular, the intermediate layer is preferably formed of a nitride of a group-III element in the periodic table.

Next, a method of forming the intermediate layer 12 will be described.

As a method of activating and reacting a group-III metal raw material with gas including a group-V element in plasma to form the intermediate layer 12 made of a group-III nitride compound, any of the following methods may be used: a sputtering method; a pulsed laser deposition (PLD) method; and a pulsed electron beam deposition (PED) method.

As a method of generating plasma, any of the following methods may be used: a sputtering method of applying a high voltage with a specific degree of vacuum to generate discharge; a PLD method of radiating a laser beam with high energy density to generate plasma; and a PED method of radiating an electron beam to generate plasma. Among the above-mentioned methods, the sputtering method is preferable since it is simple and is suitable for mass production. It has been known that, in the sputtering method, when a nitrogen gas is used as a group-V element to form a film, nitrogen is adhered to the surface of a target (metal material) (see Mat. Res. Soc. Symp. Proc. Vol. 68, 357, 1986).

In general, when a metal material target is used to perform sputtering, a DC sputtering method is preferable in terms of deposition efficiency. However, in this case, nitrogen is adhered to the target. As a result, the surface of the target is charged up, and the deposition rate is likely to be unstable. Therefore, it is preferable to use a pulsed DC sputtering method or an RF sputtering method.

In the sputtering method, a technique for confining plasma in a magnetic field to improve deposition efficiency has generally been used. In order to uniformly use a target, it is preferable to use an RF sputtering method that changes the position of a magnet of a cathode in a target during deposition. A method of swing the magnet can be appropriately selected depending on the kind of sputtering apparatus. For example, it is possible to tilt or rotate the magnet.

Figure 5:
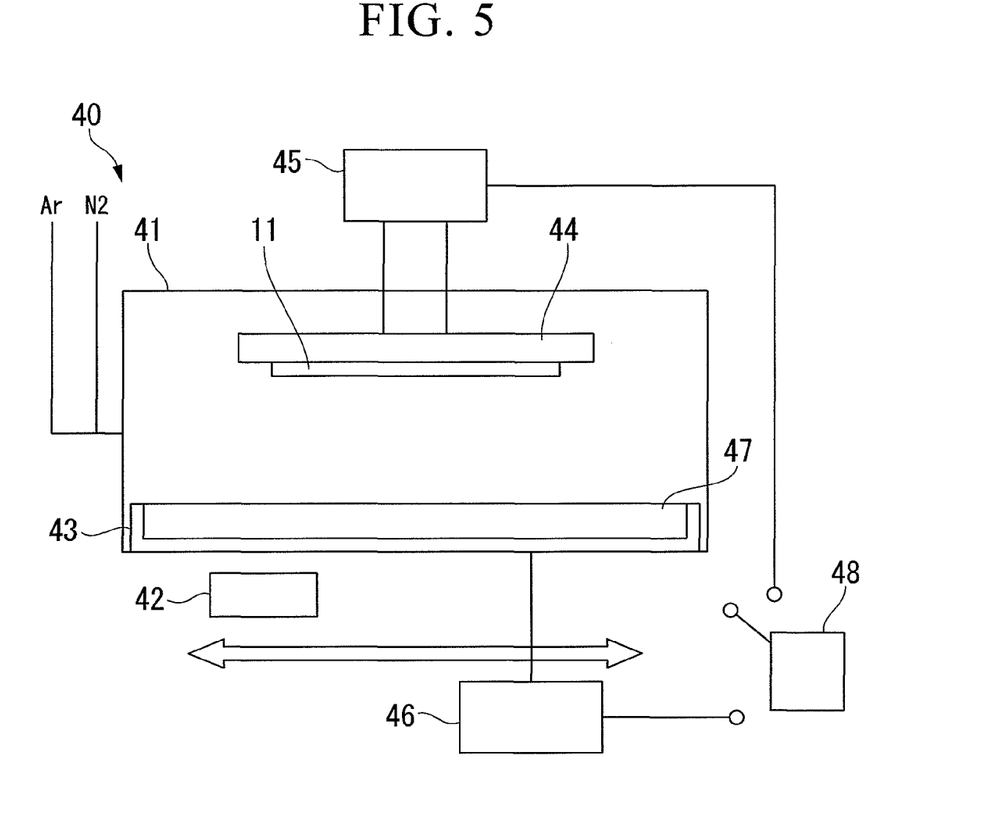
FIG. 5 is a diagram schematically illustrating an example of a method of manufacturing the group-III nitride compound semiconductor light-emitting device according to the present invention, and shows the schematic structure of a sputtering apparatus.

In an RF sputtering apparatus 40 shown in FIG. 5, a magnet 42 is provided below a metal target 47 (a lower side in FIG. 5), and the magnet 42 is tilted below the metal target 47 by a driving device (not shown). A nitrogen gas and an argon gas are supplied into a chamber 41, and an intermediate layer is formed on the substrate 11 attached to a heater 44. In this case, as described above, since the magnet 42 is tilted below the metal target 47, the plasma confined in the chamber 41 is moved. Therefore, it is possible to form a uniform intermediate layer on the side surface of the substrate 11 as well as the front surface 11a.

When the intermediate layer 12 is formed by the sputtering method, it is preferable to use a reactive sputtering method that introduces gas including nitrogen into a reactor since it can control reaction to maintain high crystallinity and stably reproduce high crystallinity.

When the sputtering method, particularly, the reactive sputtering method is used to form the intermediate layer 12, important parameters other than the temperature of the substrate 11 include, for example, the partial pressure of nitrogen and the internal pressure of a furnace.

It is preferable that the percentage of nitrogen in the gas including nitrogen, that is, the ratio of the flow rate of nitrogen ($N_2$) to the flow rate of Ar be higher than 20%. If the percentage of nitrogen is lower than 20%, the amount of nitrogen is small, and metal is deposited on the substrate 11. As a result, the intermediate layer 12 does not have a crystal structure required for a group-III nitride compound. If the percentage of nitrogen is more than 90%, the amount of Ar is excessively small, and the sputtering rate is considerably reduced, which is not preferable. Therefore, it is preferable that the percentage of nitrogen in the gas including nitrogen be in the range of 40 to 90%.

In this embodiment, it is possible to supply an active nitrogen reactive species to the substrate 11 with high concentration to prevent migration on the substrate 11. In this way, it is possible to prevent self-organization and form the intermediate layer 12 having a columnar crystal structure.

In addition, it is possible to control the crystallinity of a semiconductor layer that is made of GaN on the intermediate layer 12 by adjusting the density of an interface between the columnar crystals of the intermediate layer 12.

It is preferable that the internal pressure of a furnace be higher than 0.2 Pa when the sputtering method is used to form the intermediate layer 12. If the internal pressure of a furnace is lower than 0.2 Pa, the kinetic energy of a generated reactive species is excessively high, and the intermediate layer has an insufficient film quality. The upper limit of the internal pressure of the furnace is not particularly limited. However, when the internal pressure is higher than 0.8 Pa, dimeric charged particles contributing to the alignment of a film are affected by interaction between the charged particles in plasma. Therefore, it is preferable that the internal pressure of the furnace be in the range of 0.2 to 0.8 Pa.

It is preferable that a wet pre-process be performed on the substrate 11. For example, a known RCA cleaning method is performed on the substrate made of silicon to hydrogen-terminate the front surface of the substrate. In this way, the deposition process is stabilized when the intermediate layer is formed on the substrate during a sputtering process, which will be described in detail below.

In addition, after the substrate 11 is put into a reactor, it is possible to perform a pre-process on the substrate using, for example, a reverse sputtering method, before the intermediate layer 12 is formed. Specifically, it is possible to arrange the front surface of the substrate 11 by exposing the substrate in Ar or $N_2$ plasma.

For example, it is possible to remove an organic material or an oxide adhered to the front surface of the substrate 11 by exposing the front surface of the substrate 11 in, for example, Ar gas or $N_2$ gas plasma. In this case, when a voltage is applied between the substrate 11 and the chamber, plasma particles effectively act on the substrate 11.

When the pre-process is performed on the substrate 11, it is possible to form the intermediate layer 12 on the entire front surface 11a of the substrate 11, and improve the crystallinity of a film formed on the intermediate layer.

When the intermediate layer 12 is formed, the deposition rate is preferably in the range of 0.01 nm/s to 10 nm/s. If the deposition rate is lower than 0.01 nm/s, a film is not formed, but is scattered in an island shape. As a result, it is difficult to cover the entire front surface of the substrate 11. If the deposition rate is higher than 10 nm/s, a crystal film is not formed, but an amorphous film is formed.

When the intermediate layer 12 is formed, the temperature of the substrate 11 is preferably in the range of room temperature to 1,000° C., and more preferably, 200 to 800° C. If the temperature of the substrate 11 is lower than the lower limit, it is difficult for the intermediate layer 12 to cover the entire surface of the substrate 11, and the surface of the substrate 11 is likely to be exposed. If the temperature of the substrate 11 is higher than the upper limit, the migration of a metal raw material is activated, and a film made of a single crystal, not a columnar crystal, is formed. This film is not suitable as the intermediate layer 12.

The room temperature described in the present invention is affected by a manufacturing environment, and is generally in the range of 0 to 30° C.

In order to deposit a mixed crystal as an intermediate layer using a deposition method of changing a metal raw material into plasma, any of the following methods may be used: a method of preparing a target made of a mixture of metal materials (an alloy is not necessarily formed) in advance; and a method of preparing two targets made of different materials and sputtering the targets at the same time. For example, when a film having a predetermined composition is formed, a target made of a mixture of materials may be used. When several films having different compositions are formed, a plurality of targets may be provided in the chamber.

A commonly known nitride compound may be used as the gas including nitrogen (group-V element) used in this embodiment, without any restrictions. However, it is preferable that ammonia or nitrogen ($N_2$) that is relatively inexpensive and easy to treat be used as the gas.

It is preferable to use ammonia because it has high decomposition efficiency and can be deposited at a high growing speed. However, ammonia has high reactivity and toxicity. Therefore, ammonia requires a detoxification facility or a gas detector, and it is necessary that a member used for a reactor be made of a material having high chemical stability.

When nitrogen ($N_2$) is used as a raw material, a simple apparatus can be used, but it is difficult to obtain a high reaction rate. However, when a method of decomposing nitrogen with, for example, an electric field or heat and introducing it into an apparatus is used, it is possible to obtain a deposition rate that is sufficient for industrial manufacture but is lower than that when ammonia is used. Therefore, nitrogen is most preferable in terms of manufacturing costs.

As described above, it is preferable that the intermediate layer 12 be formed so as to cover the side surface of the substrate 11. In addition, it is most preferable that the intermediate layer 12 be formed so as to cover the side surface and the rear surface of the substrate 11. However, when an intermediate layer is formed by a deposition method according to the related art, it is necessary to perform a maximum of 6 to 8 deposition processes, and it takes a long time to form the intermediate layer. As another deposition method, the following may be used: a method of arranging a substrate in a chamber without holding the substrate to form an intermediate layer on the entire surface of the substrate. However, in this case, when it is necessary to heat the substrate, the manufacturing apparatus becomes complicated.

Therefore, for example, a deposition method is considered which tilts or rotates a substrate to change the position of the substrate in the sputtering direction of a film-forming material during deposition. In this method, a film is formed on the front surface and the side surface of the substrate by one process and a film is formed on the rear surface of the substrate by the next deposition process. That is, it is possible to form a film on the entire surface of the substrate by a total of two processes.

In addition, the following method may be used: a method of generating a film-forming material from a large source, changing the position where the material is generated, and forming a film on the entire surface of a substrate without moving the substrate. As described above, an example of the method is an RF sputtering method that tilts or rotates a magnet to move the position of the magnet of a cathode in a target during deposition. When the RF sputtering method is used to form a film, both the substrate and the cathode may be moved. In addition, the cathode, which is a material source, may be provided in the vicinity of the substrate to supply plasma so as to surround the substrate without supplying beam-shaped plasma to the substrate. In this case, it is possible to simultaneously form a film on the front surface and the side surface of the substrate.

[Laminated Semiconductor]

As shown in FIG. 1, in the laminated semiconductor 10 according to this embodiment, the semiconductor layer 20 including the n-type semiconductor layer 14, the light-emitting layer 15, and the p-type semiconductor layer 16 each made of a nitride compound semiconductor is formed on the substrate 11 with the intermediate layer 12 interposed therebetween.

The n-type semiconductor layer 14 includes at least an underlying layer 14a made of a group-III nitride compound semiconductor, and the underlying layer 14a is formed on the intermediate layer 12.

As described above, a crystal laminated structure having the same function as the laminated semiconductor 10 shown in FIG. 1 can be formed on the underlying layer 14a made of a group-III nitride compound semiconductor. For example, when a semiconductor laminated structure for a light-emitting device is formed, an n-type conductive layer doped with an n-type dopant, such as Si, Ge, or Sn, or a p-type conductive layer doped with a p-type dopant, such as Mg, may be formed. For example, a light-emitting layer may be formed of InGaN, and a clad layer may be formed of AlGaN. As such, a group-III nitride semiconductor crystal layer having an additional function can be formed on the underlying layer 14a to manufacture a wafer having a semiconductor laminated structure. The wafer is used to manufacture, for example, a light-emitting diode, a laser diode, or an electronic device.

Next, the laminated semiconductor 10 will be described in detail.

As the gallium compound semiconductor, various kinds of gallium nitride compound semiconductors have been known which are represented by the general formula $Al_xGa_yIn_zN_{1-A}M_A$ ($0 \leq X \leq 1, 0 \leq Y \leq 1, 0 \leq Z \leq 1$, and $X+Y+Z=1$. M indicates a group-V element different from nitrogen (N) and $0 \leq A < 1$). The present invention can also use any kind of gallium nitride compound semiconductor represented by the general formula $Al_xGa_yIn_zN_{1-A}M_A$ ($0 \leq X \leq 1, 0 \leq Y \leq 1, 0 \leq Z \leq 1$, and $X+Y+Z=1$. M indicates a group-V element different from nitrogen (N) and $0 \leq A < 1$) in addition to the known gallium nitride compound semiconductors.

The gallium nitride compound semiconductor may include group-III elements other than Al, Ga, and In, and it may include elements, such as Ge, Si, Mg, Ca, Zn, Be, P, As, and B, if necessary. In addition, it may include dopants, a raw material, and a very small amount of dopants contained in a reaction coil material that are necessarily contained depending on the deposition conditions, in addition to the elements that are intentionally added.

A method of growing the gallium nitride compound semiconductor is not particularly limited. For example, any method of growing a nitride compound semiconductor, such as an MOCVD (metal organic chemical vapor deposition) method, an HVPE (hydride vapor phase epitaxy) method, or an MBE (molecular beam epitaxy) method, may be used to grow the gallium nitride compound semiconductor. The MOCVD method is preferable in terms of the control of the thickness of a film and mass production. In the MOCVD method, hydrogen ($H_2$) or nitrogen ($N_2$) is used as a carrier gas, trimethylgallium (TMG) or triethylgallium (TEG) is used as a Ga source, which is a group-III element, trimethylaluminum (TMA) or triethylaluminum (TEA) is used as an Al source, trimethylindium (TMI) or triethylindium (TEI) is used as an In source, and ammonia ($NH_3$) or hydrazine ($N_2H_4$) is used as a nitrogen (N) source, which is a group-V element. In addition, for example, Si-based materials, such as monosilane ($SiH_4$) and disilane ($Si_2H_6$), and Ge-based materials, that is, organic germanium compounds, such as germane ($GeH_4$), tetramethylgermanium ($(CH_3)_4Ge$), and tetraethylgermanium ($(C_2H_5)_4Ge$), are used as n-type dopants. In the MBE method, elemental germanium may be used as a dopant source. Mg-based materials, such as bis-cyclopentadienylmagnesium ($Cp_2Mg$) and bisethylcyclopentadienyl magnesium ($EtCp_2Mg$), are used as p-type dopants.

<N-Type Semiconductor Layer>

The n-type semiconductor layer 14 is generally formed on the intermediate layer 12, and includes the underlying layer 14a, an n-type contact layer 14b, and an n-type clad layer 14c. The n-type contact layer may also serve as the underlying layer and/or the n-type clad layer. The underlying layer may also serve as the n-type contact layer and/or the n-type clad layer.

[Underlying Layer]

The underlying layer 14a is formed of a group-III nitride compound semiconductor, and is formed on the intermediate layer 12.

The underlying layer 14a may be formed of a material different from the material forming the intermediate layer 12 formed on the substrate 11. The underlying layer 14a is preferably formed of $Al_xGa_{1-x}N$ ($0 \leq x \leq 1$, preferably, $0 \leq x \leq 0.5$, and more preferably, $0 \leq x \leq 0.1$).

The inventors' experiments proved that the underlying layer 14a was preferably formed of a group-III nitride compound including Ga, that is, a GaN compound semiconductor.

It is necessary to form a dislocation loop by migration such that the underlying layer does not succeed to the crystallinity of the intermediate layer 12 having a hexagonal close-packed structure. For example, a GaN-based compound semiconductor may be used as a material that is likely to form the dislocation loop. In particular, AlGaN or GaN is preferable.

The thickness of the underlying layer is preferably greater than 0.1 μm, more preferably, greater than 0.5 μm, and most preferably, greater than 1 μm. If the thickness is greater than the above-mentioned range, it is easy to obtain an $Al_xGa_{1-x}N$ layer with high crystallinity.

The underlying layer 14a may be doped with a dopant, if necessary, or the underlying layer 14a may be undoped.

For example, when a conductive substrate is used as the substrate 11, as described above, it is possible to form electrodes on both surfaces of a chip of a light-emitting device by doping the underlying layer 14a with a dopant such that a current flows through the underlying layer 14a in the longitudinal direction.

When the substrate 11 is formed of an insulating material, it is possible to form a chip structure in which electrodes are formed on the same surface of a chip of a light-emitting device. Therefore, it is not necessary to dope the underlying layer 14a formed on the substrate 11 with the intermediate layer 12 interposed therebetween with a dopant, and it is preferable that the underlying layer 14a be undoped in order to improve crystallinity.

Next, a method of forming the underlying layer 14a will be described.

In this embodiment, after the intermediate layer 12 is formed on the substrate 11 by the above-mentioned method, the underlying layer 14a made of a group-III nitride compound semiconductor can be formed on the intermediate layer. Before the underlying layer 14a is formed, it is not particularly necessary to perform an annealing process. However, in general, when a group-III nitride compound semiconductor film is formed by a chemical vapor deposition method, such as MOCVD, MBE, or VPE, a temperature-increasing process and a temperature-stabilizing process not involving film deposition are needed, and during these processes, a group-V raw material gas is generally introduced into the chamber. As a result, an annealing effect is obtained.

In this case, a general gas may be used as a carrier gas, without any restrictions, or hydrogen or nitrogen that is generally used in a chemical vapor deposition method, such as MOCVD, may be used as the carrier gas. However, when hydrogen that is relatively chemically active is used as the carrier gas, the crystallinity of the underlying layer or the flatness of a crystal surface may be damaged. Therefore, it is preferable to shorten the process time.

The method of forming the underlying layer 14a is not particularly limited. As described above, any crystal-growing method may be used as long as it can form a dislocation loop. In particular, MOCVD, MBE, or VPE is preferable to form a film having high crystallinity since it can generate the above-mentioned migration. Among them, MOCVD is more preferable since it can form a film having the highest crystallinity.

In addition, a sputtering method may be used to form the underlying layer 14a made of a group-III nitride compound semiconductor. When the sputtering method is used, it is possible to simplify the structure of an apparatus, as compared to MOCVD or MBE.

When the sputtering method is used to form the underlying layer 14a, it is preferable to use a reactive sputtering method that introduces a group-V raw material into a reactor since the reactive sputtering method can control reaction to maintain high crystallinity and stably reproduce high crystallinity.

The temperature of the substrate 11 when the underlying layer 14a is formed, that is, the deposition temperature of the underlying layer 14a is preferably higher than 800° C. When the temperature of the substrate 11 is high during the deposition of the underlying layer 14a, atoms are more likely to migrate, and it is easy to form a dislocation loop. In addition, the temperature of the substrate 11 is more preferably higher than 900° C., and most preferably, higher than 1,000° C.

For example, the temperature of the substrate 11 when the underlying layer 14a is formed needs to be lower than the decomposition temperature of crystal. For example, it is preferable that the temperature of the substrate be lower than 1,200° C. When the temperature of the substrate 11 during the deposition of the underlying layer 14a is in the above-mentioned range, it is possible to obtain the underlying layer 14a having high crystallinity.

[N-Type Contact Layer]

It is preferable that the n-type contact layer 14b be formed of $Al_xGa_{1-x}N$ ($0<x\leq 1$, preferably, $0\leq x\leq 0.5$, and more preferably, $0\leq x\leq 0.1$), similar to the underlying layer 14a. The n-type contact layer is preferably doped with an n-type dopant in the concentration range of $1\times 10^{17}$ to $1\times 10^{19}/cm^3$, and more preferably, $1\times 10^{18}$ to $1\times 10^{19}/cm^3$, in order to maintain good ohmic contact with the negative electrode, prevent the occurrence of cracks, and maintain high crystallinity. For example, Si, Ge, and Sn, and preferably, Si and Ge are used as the n-type dopant, but the present invention is not limited thereto. The deposition temperature of the n-type contact layer is the same as that of the underlying layer. As described above, the n-type contact layer 14b may also serve as the underlying layer.

It is preferable that the gallium nitride compound semiconductors forming the underlying layer 14a and the n-type contact layer 14b have the same composition. The sum of the thicknesses of the underlying layer and the n-type contact layer is preferably in the range of 0.1 to 20 μm, more preferably, 0.5 to 15 μm, most preferably, 1 to 12 μm. When the thickness is in the above-mentioned range, it is possible to maintain the crystallinity of the semiconductor at a high level.

[N-type Clad Layer]

It is preferable to provide the n-type clad layer 14c between the n-type contact layer 14b and the light-emitting layer 15, which will be described below. The n-type clad layer 14c makes it possible to restore the unevenness of the outer surface of the n-type contact layer 14b. The n-type clad layer 14c may be formed of, for example, AlGaN, GaN, or GaInN. In addition, a heterojunction structure of these layers or a superlattice structure of a plurality of layers may be used. When the n-type clad layer is formed of GaInN, it is preferable that the band gap of GaInN of the n-type clad layer be larger than that of GaInN of the light-emitting layer 15.

The thickness of the n-type clad layer 14c is not particularly limited, but is preferably in the range of 5 to 500 nm, and more preferably, 5 to 100 nm.

The n-type dopant concentration of the n-type clad layer 14c is preferably in the range of $1\times 10^{17}$ to $1\times 10^{20}/cm^3$, and more preferably, $1\times 10^{18}$ to $1\times 10^{19}/cm^3$.

If the dopant concentration is within the above-mentioned range, it is possible to maintain high crystallinity and reduce the driving voltage of a light-emitting device.

<P-type Semiconductor Layer>

In general, the p-type semiconductor layer 16 includes a p-type clad layer 16a and a p-type contact layer 16b. However, the p-type contact layer may also serve as the p-type clad layer.

[P-type Clad Layer]

The p-type clad layer 16a is not particularly limited as long as it has a composition that has a band gap energy higher than that of the light-emitting layer 15 and it can confine carriers in the light-emitting layer 15. It is preferable that the p-type clad layer be formed of $Al_dGa_{1-d}N$ ($0<d\leq 0.4$, and preferably, $0.1\leq d\leq 0.3$). When the p-type clad layer 16a is formed of AlGaN, it is possible to confine carriers in the light-emitting layer 15. The thickness of the p-type clad layer 16a is not particularly limited, but is preferably in the range of 1 to 400 nm, and more preferably, 5 to 100 nm. The p-type dopant concentration of the p-type clad layer 16a is preferably in the range of $1\times 10^{18}$ to $1\times 10^{21}/cm^3$, more preferably, $1\times 10^{19}$ to $1\times 10^{20}/cm^3$. This p-type dopant concentration range makes it possible to obtain a good p-type crystal without deteriorating crystallinity.

[P-type Contact Layer]

The p-type contact layer 16b is composed of a gallium nitride compound semiconductor layer containing at least $Al_eGa_{1-e}N$ ($0 \leq e < 0.5$, preferably, $0.5 \leq e \leq 0.2$, more preferably, $0 \leq e \leq 0.1$). When the Al composition is within the above range, it is possible to maintain high crystallinity and low ohmic contact resistance with a p-type ohmic electrode (see a transparent electrode 17, which will be described below).

When the p-type dopant concentration is in the range of $1 \times 10^{18}$ to $1 \times 10^{21}/cm^3$, it is possible to maintain low ohmic contact resistance, prevent the occurrence of cracks, and maintain high crystallinity. It is more preferable that the p-type dopant concentration be in the range of $5 \times 10^{19}$ to $5 \times 10^{20}/cm^3$.

For example, the p-type dopant may be Mg, but is not limited thereto.

The thickness of the p-type contact layer 16b is not particularly limited, but is preferably in the range of 10 to 500 nm, and more preferably, 50 to 200 nm. This thickness range makes it possible to improve emission power.

<Light-emitting Layer>

The light-emitting layer 15 is formed between the n-type semiconductor layer 14 and the p-type semiconductor layer 16. As shown in FIG. 1, the light-emitting layer is formed by alternately laminating barrier layers 15a made of a gallium nitride compound semiconductor and well layers 15b made of a gallium nitride compound semiconductor including indium, and the barrier layers 15a are arranged so as to contact the n-type semiconductor layer 14 and the p-type semiconductor layer 16.

In the structure shown in FIG. 1, the light-emitting layer 15 includes six barrier layers 15a and five well layers 15b alternately formed. The barrier layers 15a are arranged at the uppermost and lowermost sides of the light-emitting layer 15, and the well layer 15b is arranged between the barrier layers 15a.

The barrier layer 15a is preferably formed of, for example, a gallium nitride compound semiconductor, such as $Al_cGa_{1-c}N$ ($0 \leq c \leq 0.3$), having a band gap energy that is higher than that of the well layer 15b that is formed of a gallium nitride compound semiconductor including indium.

The well layer 15b may be formed of a gallium indium nitride, such as $Ga_{1-s}In_sN$ ($0 < s < 0.4$), as the gallium nitride compound semiconductor including indium.

The overall thickness of the light-emitting layer 15 is not particularly limited, but it is preferable that the light-emitting layer 15 have a sufficient thickness to obtain a quantum effect, that is, a threshold thickness. For example, the thickness of the light-emitting layer 15 is preferably in the range of 1 to 500 nm, more preferably, about 100 nm. If the thickness is in the above-mentioned range, it is possible to improve emission power.

[Transparent Positive Electrode]

The transparent positive electrode 17 is a transparent electrode formed on the p-type semiconductor layer 16 of the laminated semiconductor 10 manufactured in this way.

The material forming the transparent positive electrode 17 is not particularly limited, but the transparent positive electrode 17 may be formed of, for example, ITO ($In_2O_3$—$SnO_2$), AZO (ZnO—$Al_2O_3$), IZO ($In_2O_3$—ZnO), or GZO (ZnO—$Ga_2O_3$) by a known means. In addition, the transparent positive electrode 17 may have any known structure, without any restrictions.

The transparent positive electrode 17 may be formed so as to cover the entire surface of the p-type semiconductor layer 16 doped with Mg, or it may be formed in a lattice shape or a tree shape. After the transparent positive electrode 17 is formed, a thermal annealing process may be performed to form an alloy or make the electrode transparent, or the thermal annealing process may not be performed.

[Positive Electrode Bonding Pad and Negative Electrode]

A positive electrode bonding pad 18 is an electrode that is formed on the transparent positive electrode 17.

The positive electrode bonding pad 18 may be formed of various known materials, such as Au, Al, Ni, and Cu. However, the known materials and the structure of the positive electrode bonding pad are not particularly limited.

It is preferable that the thickness of the positive electrode bonding pad 18 be in the range of 100 to 1000 nm. In addition, the bonding pad has characteristics that, as the thickness thereof increases, bondability is improved. Therefore, it is preferable that the thickness of the positive electrode bonding pad 18 be greater than or equal to 300 nm. In addition, it is preferable that the thickness of the positive electrode bonding pad 18 be less than or equal to 500 nm in order to reduce manufacturing costs.

A negative electrode 19 is formed so as to come into contact with the n-type contact layer 14b of the n-type semiconductor layer 14 in the semiconductor layer, which is a laminate of the n-type semiconductor layer 14, the light-emitting layer 15, and the p-type semiconductor layer 16 sequentially formed on the substrate 11.

Therefore, when the negative electrode bonding pad 17 is formed, the p-type semiconductor layer 16, the light-emitting layer 15, and the n-type semiconductor layer 14 are partially removed to form an exposed region 14d of the n-type contact layer 14b and the negative electrode 19 is formed on the exposed region.

The negative electrode 19 may be formed of any material whose composition and structure have been known, and the negative electrode can be formed by a means that has been known in this technical field.

According to the method of manufacturing the group-III nitride compound semiconductor light-emitting device of this embodiment, the intermediate layer 12 is formed on the substrate 11 by a method of activating a raw material using plasma, such as a sputtering method, such that the intermediate layer 12 has a thickness in the above-mentioned range. In this way, it is possible to form the intermediate layer 12, which is a uniform crystal film, in a short time. In addition, it is possible to form the intermediate layer 12 as an alignment film having specific anisotropy on any kind of substrate.

Further, since the deposition rate of the intermediate layer 12 is increased, it is possible to prevent impurities adhered to the inside of a furnace from being mixed with a film. In addition, since the intermediate layer 12 having a hexagonal close-packed structure is formed, the intermediate layer 12 effectively serves as a buffer layer, and the semiconductor layer 20 that is made of a group-III nitride compound semiconductor and is formed on the intermediate layer becomes a crystal film having high crystallinity.

Therefore, it is possible to effectively grow on the substrate 11 the intermediate layer 12 that is made of a group-III nitride compound and has high crystallinity and a semiconductor layer that is made of a group-III nitride semiconductor. As a result, it is possible to obtain a group-III nitride compound semiconductor light-emitting device that has high productivity and good emission characteristics and is inexpensive.

[Lamp]

A lamp can be formed by combining the group-III nitride compound semiconductor light-emitting device according to the present invention with phosphor by a known means. In recent years, a technique for combining a light-emitting device with phosphor to change the color of emission light has been known, and the lamp according to the present invention can adopt the technique without any restrictions.

For example, it is possible to emit light having a long wavelength from the light-emitting device by appropriately selecting the phosphor used for the lamp. In addition, it is possible to achieve a lamp emitting white light by mixing the emission wavelength of the light-emitting device and a wavelength converted by the phosphor.

In addition, the light-emitting device according to the present invention may be used for various types of lamps, such as a general-purpose bomb-shaped lamp, a side view lamp for a backlight of a portable device, and a top view lamp used for a display device.

Figure 4:
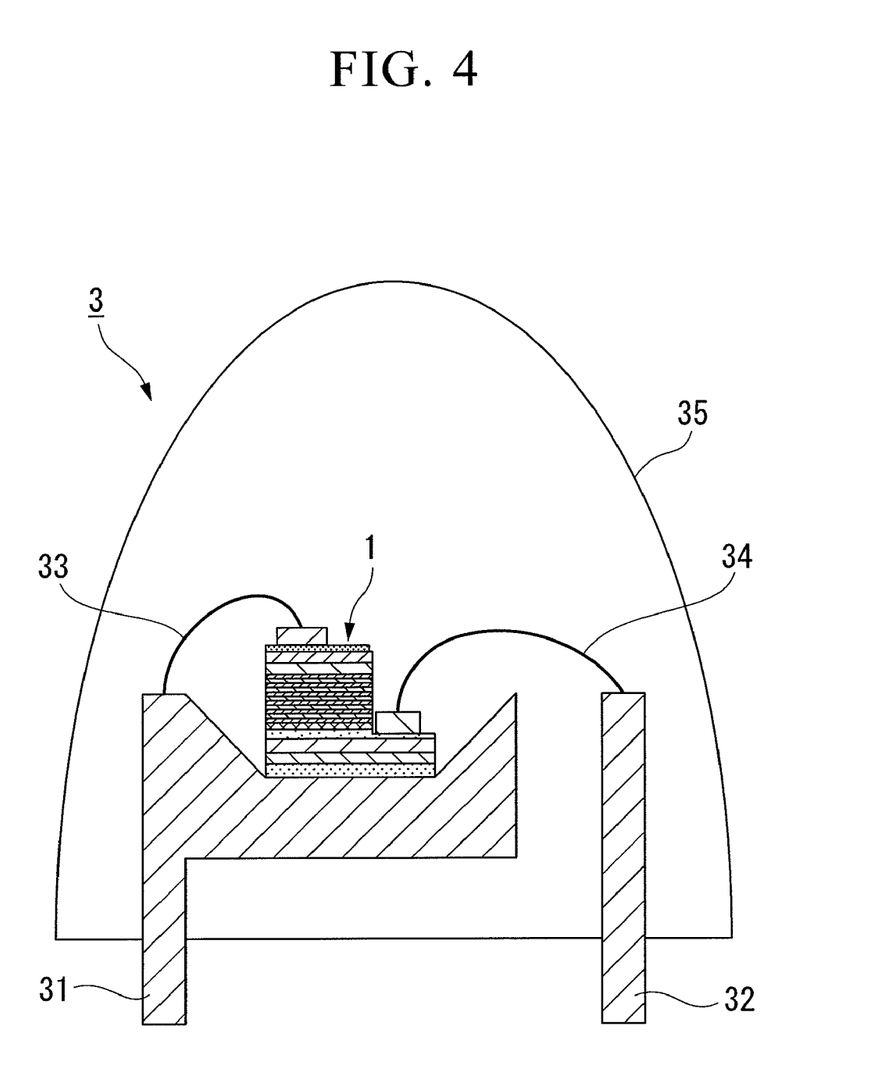
FIG. 4 is a diagram schematically illustrating a lamp including the group-III nitride compound semiconductor light-emitting device according to the present invention.

For example, as shown in FIG. 4, when the group-III nitride compound semiconductor light-emitting device 1 having electrodes formed on the same surface is mounted to a bomb-shaped lamp, the light-emitting device 1 is bonded to one (a frame 31 in FIG. 4) of two frames. In addition, the negative electrode (see reference numeral 19 in FIG. 3) of the light-emitting device 1 is bonded to a frame 32 by a wire 34, and the positive electrode bonding pad (see reference numeral 18 in FIG. 3) of the light-emitting device 1 is bonded to a frame 31 by a wire 33. Then, the periphery of the light-emitting device 1 is sealed by a mold 35 made of a transparent resin. In this way, it is possible to manufacture a bomb-shaped lamp 3 shown in FIG. 4.

The group-III nitride compound laminated semiconductor according to the present invention can be applied to manufacture, for example, photoelectric conversion devices, such as a laser device and a light-receiving device, and electronic devices, such as an HBT and an HEMT, in addition to the light-emitting device. These semiconductor devices have various known structures, and the semiconductor laminated structure formed on the underlying layer 14a of the light-emitting device 1 according to this embodiment may include these known device structures.

EXAMPLES

Next, the group-III nitride compound semiconductor light-emitting device according to the present invention will be described in detail with reference to Examples, but the present invention is not limited to the Examples.

[Manufacture of Sample]

FIG. 1 is a cross-sectional view schematically illustrating the structure of a laminated semiconductor of a group-III nitride compound semiconductor light-emitting device manufactured in this experimental example.

In this example, an aggregate of columnar crystals made of MN was formed as the intermediate layer 12 on the c-plane of the substrate 11 made of sapphire by an RF sputtering method, and a layer made of GaN was formed as the underlying layer 14a on the intermediate layer by an MOCVD method. Then, various semiconductor layers made of GaN were formed on the underlying layer 14a by the MOCVD method.

The sapphire substrate 11 whose one surface was polished into a mirror surface suitable for epitaxial growth was prepared, and the substrate 11 was put in a sputtering apparatus, without being subjected to a pre-process, such as a wet process. The sputtering apparatus that had a radio frequency power supply and a mechanism capable of changing the position of a magnet in a target was used.

Then, the substrate 11 was heated up to a temperature of 750° C. in the sputtering apparatus and a nitrogen gas was introduced into the sputtering apparatus at a flow rate of 15 sccm to maintain the internal pressure of the chamber at 0.08 Pa. Then, an RF bias of 50 W was applied to the substrate 11 to generate nitrogen plasma, thereby cleaning the surface of the substrate 11.

Then, argon and nitrogen gases were introduced into the sputtering apparatus while maintaining the temperature of the substrate 11. Then, an RF power of 2,000 W was supplied to an Al target to form the intermediate layer 12 made of AlN on the sapphire substrate 11 under the following conditions: an internal pressure of a furnace of 0.5 Pa; a flow rate of Ar gas of 5 sccm; and a flow rate of nitrogen gas of 15 sccm (the percentage of nitrogen in the entire gas was 75%). The deposition rate was 0.067 nm/s. The magnet in the target was tilted both during the cleaning of the substrate 11 and during deposition.

An AlN film (intermediate layer 12) was formed with a thickness of 40 nm at a predetermined deposition rate for a predetermined time, and then a plasma operation stopped to reduce the temperature of the substrate 11.

Then, the substrate 11 having the intermediate layer 12 formed thereon was taken out from the sputtering apparatus and then put into an MOCVD furnace. Then, a sample having a GaN layer (group-III nitride semiconductor) formed thereon was manufactured by an MOCVD method as follows.

First, the substrate 11 was put into a reactive furnace. The substrate 11 was loaded on a carbon susceptor for heating in a glove box filled with a nitrogen gas. Then, the nitrogen gas was introduced into the furnace, and a heater was operated to increase the temperature of the substrate 11 to 1,150° C. After it was checked that the temperature of the substrate 11 was stabilized at 1,150° C., a valve for an ammonia pipe was opened to introduce ammonia into the furnace. Then, hydrogen including the vapor of trimethylgallium (TMG) was supplied into the furnace to deposit a GaN-based semiconductor for forming the underlying layer 14a on the intermediate layer 12 formed on the substrate 11. The amount of ammonia was adjusted such that the ratio of V to III was 6000. The GaN-based semiconductor was grown for about one hour, and a valve for a TMG pipe was switched to stop the supply of a raw material into the furnace, thereby stopping the growth of the semiconductor. After the growth of the GaN-based semiconductor ended, the heater was turned off to reduce the temperature of the substrate 11 to room temperature.

In this way, the intermediate layer 12 that had a hexagonal close-packed structure and was made of AlN was formed on the substrate 11 made of sapphire, and the undoped underlying layer 14a that was made of a GaN-based semiconductor and had a thickness of 2 μm was formed on the intermediate layer, thereby manufacturing a sample.

The same processes as described above were performed on the substrate 11 made of sapphire at a predetermined deposition rate for a predetermined time using a sputtering apparatus to manufacture samples including intermediate layers that were made of AlN and had thicknesses of 4 nm, 20 nm, 80 nm, and 100 nm.

Then, each substrate having the intermediate layer formed thereon was put into an MOCVD furnace, and the same processes as described above were performed on the substrate to form a GaN layer (group-III nitride semiconductor) on the intermediate layer.

In this way, the intermediate layer that had a hexagonal close-packed structure and was made of AlN was formed on the substrate 11 made of sapphire, and an undoped underlying layer that was made of a GaN-based semiconductor and had a thickness of 2 μm was formed on the intermediate layer, thereby manufacturing samples.

[Evaluation of Samples]

The X-ray rocking curve (XRC) of the undoped GaN layer (underlying layer 14a) of each sample manufactured by the above-mentioned method was measured. In the measuring process, a Cuβ-line X-ray generator was used as a light source and the measurement was performed for the (0002) plane, which was an alignment plane, and the (10-10) plane, which was a vertical plane. Generally, in the case of a group-III nitride compound semiconductor, the half width of the XRC spectrum of the (0002) plane is used as an index for the flatness (mosaicity) of crystal and the half width of the XRC spectrum of the (10-10) plane is used as an index for the dislocation density (twist) of crystal. In particular, the crystallinity of the (10-10) plane is a main index for evaluating characteristics of a light-emitting device.

Figure 6:
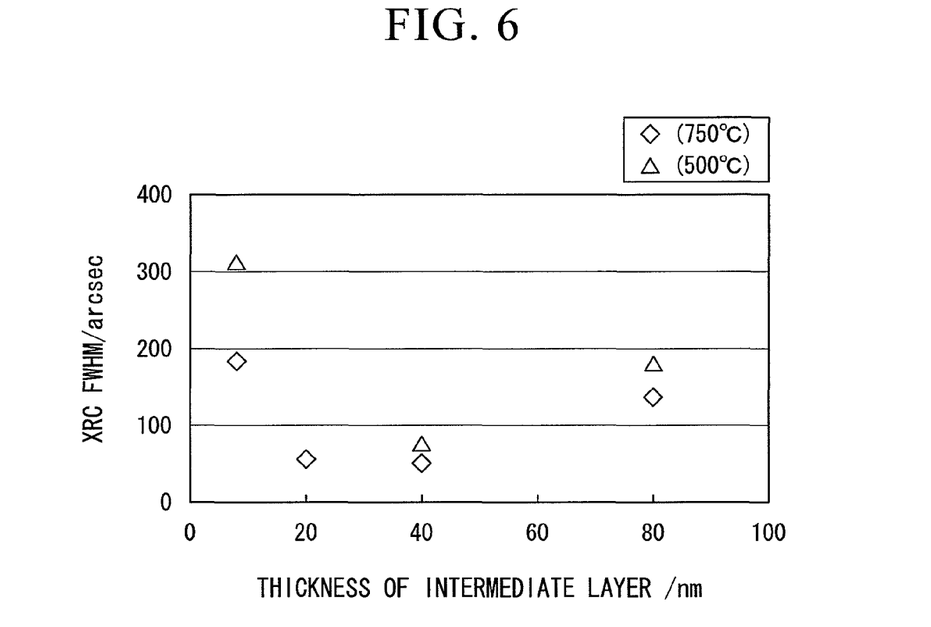
FIG. 6 is a diagram illustrating an example of the method of manufacturing the group-III nitride compound semiconductor light-emitting device according to the present invention, and is a graph illustrating the relationship between the thickness of an intermediate layer and the half width of an XRC spectrum of the (0002) plane of an undoped GaN underlying layer.

FIG. 6 is a graph illustrating the relationship between the thickness of the intermediate layer and the half width of the X-ray rocking curve (XRC) of the (0002) plane of the undoped GaN layer of each sample that is grown under the above-mentioned conditions.

Figure 7:
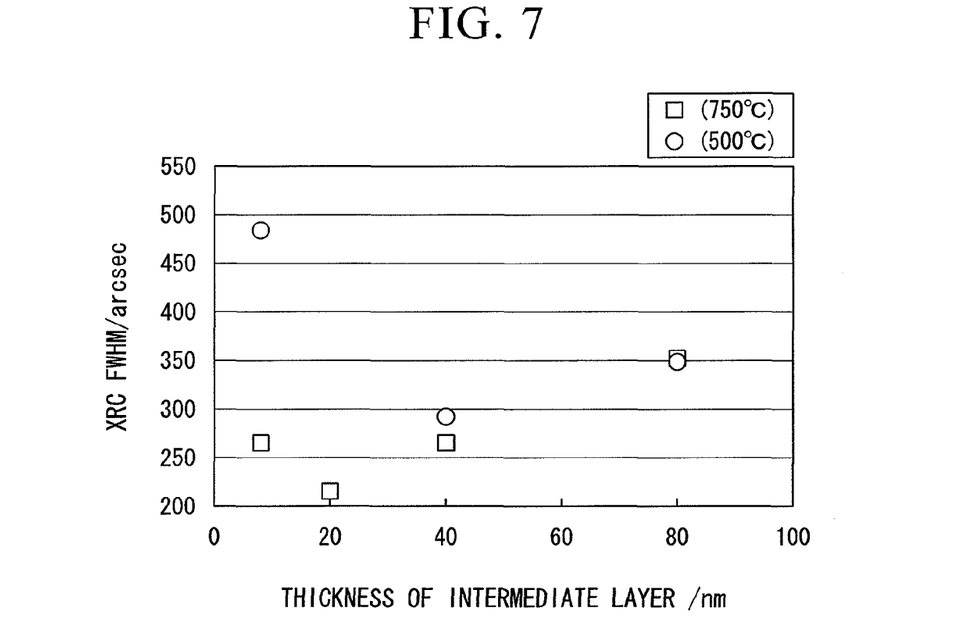
FIG. 7 is a diagram illustrating another example of the method of manufacturing the group-III nitride compound semiconductor light-emitting device according to the present invention, and is a graph illustrating the relationship between the thickness of an intermediate layer and the half width of an XRC spectrum of the (10-10) plane of an undoped GaN underlying layer.

FIG. 7 is a graph illustrating the relationship between the thickness of the intermediate layer and the half width of the X-ray rocking curve (XRC) of the (10-10) plane of the undoped GaN layer of each sample that is grown under the above-mentioned conditions.

As can be seen from FIGS. 6 and 7, in the samples obtained by forming the intermediate layers 12 that are made of AlN and have thicknesses of 20 to 80 nm on the substrate 11 using a sputtering method and forming the undoped GaN layers on the intermediate layers, when the temperature of the substrate 11 is 750° C. during the deposition of the intermediate layer 12, the half width of the XRC spectrum of the (0002) plane of the undoped GaN layer is less than 150 arcsec, and the half width of the XRC spectrum of the (10-10) plane is less than 350 arcsec. Both the (0002) plane and the (10-10) plane have high crystallinity, and have mirror surfaces.

In contrast, in a sample obtained by forming an intermediate layer having a thickness of 4 nm which is smaller than the lower limit defined by the present invention on the substrate and forming an undoped GaN layer on the intermediate layer, there is a large difference in the XRC spectrum of the undoped GaN layer between when the temperature of the substrate is 750° C. and when the temperature of the substrate is 500° C. during the deposition of the intermediate layer.

For example, when the temperature of the substrate is 750° C. during the deposition of the intermediate layer, the half width of the XRC spectrum of the (0002) plane of the undoped GaN layer is 180 arcsec. In contrast, when the temperature of the substrate is 500° C. during the deposition of the intermediate layer, the half width of the XRC spectrum thereof is 320 arcsec. Therefore, there is a large difference between the half widths. In addition, when the temperature of the substrate is 750° C. during the deposition of the intermediate layer, the half width of the XRC spectrum of the (10-10) plane of the undoped GaN layer is 270 arcsec. In contrast, when the temperature of the substrate is 500° C. during the deposition of the intermediate layer, the half width of the XRC spectrum thereof is 480 arcsec. Therefore, there is a large difference between the half widths.

The reason is that, when the thickness of the intermediate layer formed on the substrate is small and the temperature of the substrate is low, it is difficult to sufficiently cover the surface of the substrate.

When the thickness of the intermediate layer is 100 nm, the half width of the XRC spectrum of the (0002) plane of the undoped GaN layer is 615 arcsec (not shown in FIG. 6), the half width of the XRC spectrum of the (10-10) plane of the undoped GaN layer is 817 arcsec (not shown in FIG. 7), and cracks occur in the crystal film. It is considered that this is because there is lattice mismatch between AlN forming the intermediate layer and the undoped GaN layer (underlying layer 14a) formed on the intermediate layer, which results in a reduction in the crystallinity of the GaN layer.

The above-mentioned results prove that the group-III nitride compound semiconductor light-emitting device according to the present invention has high productivity and good emission characteristics.

INDUSTRIAL APPLICABILITY

The group-III nitride compound semiconductor light-emitting device according to the present invention includes an outer layer made of a group-III nitride compound semiconductor crystal having high crystallinity. Therefore, it is possible to manufacture a semiconductor light-emitting device having good emission characteristics, such as a light-emitting diode (LED), a laser diode (LD), or an electronic device, by forming a group-III nitride compound semiconductor crystal layer having an additional function on the outer layer.

The invention claimed is:

1. A group-III nitride compound semiconductor light-emitting device comprising:
    a substrate;
    an intermediate layer that is made of a group-III nitride compound, covers an entire upper surface of the substrate, has substantially uniform thickness, and is formed on the substrate by activating and reacting gas including a group-V element with a metal material in plasma; and
    an n-type semiconductor layer, a light-emitting layer, and a p-type semiconductor layer that are made of group-III nitride compound semiconductors and are sequentially formed on the intermediate layer,
    wherein nitrogen is used as the group-V element, and
    a thickness of the intermediate layer is in the range of 20 to 80 nm,
    wherein the intermediate layer has high crystallinity wherein a half width of an XRC spectrum of the (0002) plane of an undoped GaN layer is less than 150 arcsec, and a half width of an XRC spectrum of the (10-10) plane is less than 350 arcsec.

2. The group-III nitride compound semiconductor light-emitting device according to claim 1,
    wherein the intermediate layer has a composition including Al.

3. The group-III nitride compound semiconductor light-emitting device according to claim 2,
    wherein the intermediate layer is formed of AlN.

4. The group-III nitride compound semiconductor light-emitting device according to claim 1,
    wherein the intermediate layer is formed so as to cover 90% or more of a front surface of the substrate.

5. The group-III nitride compound semiconductor light-emitting device according to claim 1,
    wherein the intermediate layer is composed of an aggregate of columnar crystals.

6. The group-III nitride compound semiconductor light-emitting device according to claim 5,
    wherein, in the intermediate layer, the average of the widths of grains of the columnar crystals in the range of 1 to 100 nm.

7. The group-III nitride compound semiconductor light-emitting device according to claim 5,
wherein, in the intermediate layer, the average of the widths of grains of the columnar crystals is in the range of 2 to 70 nm.

8. The group-III nitride compound semiconductor light-emitting device according to claim 1,
wherein the intermediate layer has a hexagonal close-packed structure.

9. The group-III nitride compound semiconductor light-emitting device according to claim 1,
wherein an underlying layer included in the n-type semiconductor layer is formed on the intermediate layer.

10. The group-III nitride compound semiconductor light-emitting device according to claim 9,
wherein the underlying layer is formed of a GaN-based compound semiconductor.

11. The group-III nitride compound semiconductor light-emitting device according to claim 10,
wherein the underlying layer is formed of GaN.

12. The group-III nitride compound semiconductor light-emitting device according to claim 10,
wherein the underlying layer is formed of AlGaN.

* * * * *